(12) United States Patent
Nakao

(10) Patent No.: US 11,411,167 B2
(45) Date of Patent: Aug. 9, 2022

(54) ACTUATOR AND TACTILE SENSATION PROVIDING APPARATUS

(71) Applicant: KYOCERA Corporation, Kyoto (JP)

(72) Inventor: Fumiaki Nakao, Kawasaki (JP)

(73) Assignee: KYOCERA Corporation, Kyoto (JP)

( * ) Notice: Subject to any disclaimer, the term of this patent is extended or adjusted under 35 U.S.C. 154(b) by 1001 days.

(21) Appl. No.: 16/084,640

(22) PCT Filed: Mar. 10, 2017

(86) PCT No.: PCT/JP2017/009789
§ 371 (c)(1),
(2) Date: Sep. 13, 2018

(87) PCT Pub. No.: WO2017/163939
PCT Pub. Date: Sep. 28, 2017

(65) Prior Publication Data
US 2019/0074425 A1 Mar. 7, 2019

(30) Foreign Application Priority Data
Mar. 25, 2016 (JP) ............................. JP2016-062430

(51) Int. Cl.
| | |
|---|---|
| *H01L 41/09* | (2006.01) |
| *H02N 2/04* | (2006.01) |
| *H01L 41/04* | (2006.01) |
| *H01L 41/053* | (2006.01) |
| *B06B 1/06* | (2006.01) |
| *G06F 3/01* | (2006.01) |
| *G06F 3/041* | (2006.01) |
| *H02N 2/00* | (2006.01) |
| *H02N 2/06* | (2006.01) |

(52) U.S. Cl.
CPC ........ *H01L 41/0906* (2013.01); *B06B 1/0666* (2013.01); *G06F 3/016* (2013.01); *G06F 3/041* (2013.01); *H01L 41/042* (2013.01); *H01L 41/053* (2013.01); *H02N 2/0055* (2013.01); *H02N 2/04* (2013.01); *H02N 2/06* (2013.01)

(58) Field of Classification Search
CPC . H01L 41/0906; H01L 41/042; H01L 41/053; H02N 2/04; H02N 2/06
USPC .................................................. 310/348, 351
See application file for complete search history.

(56) References Cited

U.S. PATENT DOCUMENTS

| | | |
|---|---|---|
| 8,400,046 B2 | 3/2013 | Hayamizu |
| 9,046,947 B2 | 6/2015 | Takeda et al. |
| 9,773,965 B2 | 9/2017 | Park et al. |

(Continued)

FOREIGN PATENT DOCUMENTS

| | | |
|---|---|---|
| EP | 2 184 664 A1 | 5/2010 |
| EP | 2 202 619 A1 | 6/2010 |

(Continued)

*Primary Examiner* — Derek J Rosenau
(74) *Attorney, Agent, or Firm* — Studebaker & Brackett PC

(57) ABSTRACT

An actuator includes a piezoelectric element, a vibration plate, and a holder. The vibration plate has the piezoelectric element joined thereto and vibrates an object of vibration in accordance with expansion and contraction of the piezoelectric element. The holder is joined to the vibration plate and holds the object of vibration. The height of the holder is less than the maximum bending displacement at which the piezoelectric element is not damaged by an external force.

10 Claims, 13 Drawing Sheets

(56) References Cited

U.S. PATENT DOCUMENTS

| | | | |
|---|---|---|---|
| 2009/0096326 A1 | 4/2009 | Onishi et al. | |
| 2010/0308691 A1 | 12/2010 | Hayamizu | |
| 2013/0215080 A1 | 8/2013 | Takeda et al. | |
| 2013/0300256 A1* | 11/2013 | Kim | H01L 41/053 310/326 |
| 2014/0184545 A1 | 7/2014 | Tanaka | |
| 2014/0339958 A1 | 11/2014 | Park et al. | |
| 2015/0091414 A1* | 4/2015 | Lonnberg | G06F 3/04883 310/330 |

FOREIGN PATENT DOCUMENTS

| | | |
|---|---|---|
| EP | 2 202 620 A1 | 6/2010 |
| EP | 2 202 621 A1 | 6/2010 |
| EP | 2 207 080 A1 | 7/2010 |
| EP | 2 202 620 B1 | 2/2018 |
| JP | H01-177880 A | 7/1989 |
| JP | 2010-152888 A | 7/2010 |
| JP | 2010-200607 A | 9/2010 |
| JP | 5452729 B2 | 3/2014 |
| JP | 2014230482 A | 12/2014 |
| WO | 2007/026736 A1 | 3/2007 |
| WO | 2009063610 A1 | 5/2009 |
| WO | 2014098429 A1 | 6/2014 |

\* cited by examiner

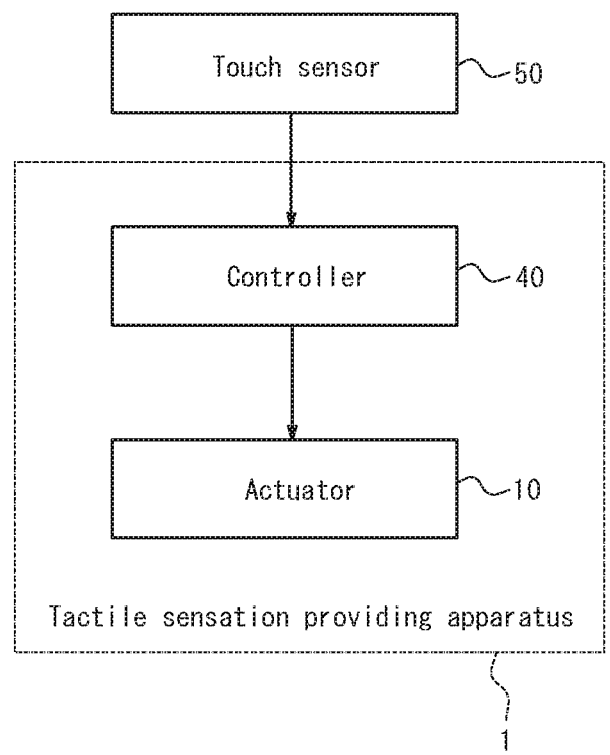

ACTUATOR AND TACTILE SENSATION PROVIDING APPARATUS

CROSS-REFERENCE TO RELATED APPLICATION

The present application claims priority to and the benefit of Japanese Patent Application No. 2016-062430 filed Mar. 25, 2016, the entire contents of which are incorporated herein by reference.

TECHNICAL FIELD

The present disclosure relates to an actuator and a tactile sensation providing apparatus.

BACKGROUND

A touch sensor or the like provided with an actuator that generates vibration is known. In such a touch sensor or the like, the actuator vibrates an object of vibration, such as the touch sensor, thereby providing a tactile sensation to a user who touches the object of vibration.

SUMMARY

An actuator according to an embodiment includes a piezoelectric element, a vibration plate, and a holder. The vibration plate has the piezoelectric element joined thereto and is configured to vibrate an object of vibration in accordance with expansion and contraction of the piezoelectric element. The holder is joined to the vibration plate and configured to hold the object of vibration. The height of the holder is less than the maximum bending displacement at which the piezoelectric element is not damaged by an external force.

A tactile sensation providing apparatus according to an embodiment includes an actuator and an object of vibration. The actuator includes a piezoelectric element, a vibration plate that has the piezoelectric element joined thereto and is configured to vibrate in accordance with expansion and contraction of the piezoelectric element, and a holder joined to the vibration plate. The object of vibration is held by the holder and is configured to provide a tactile sensation to a user by vibration of the vibration plate being transmitted to the object of vibration. The height of the holder is less than the maximum bending displacement at which the piezoelectric element is not damaged by an external force.

BRIEF DESCRIPTION OF THE DRAWINGS

In the accompanying drawings:

FIG. 3 is a functional block diagram illustrating an example of the schematic configuration of the tactile sensation providing apparatus in FIG. 1;

DETAILED DESCRIPTION

Figure 1:
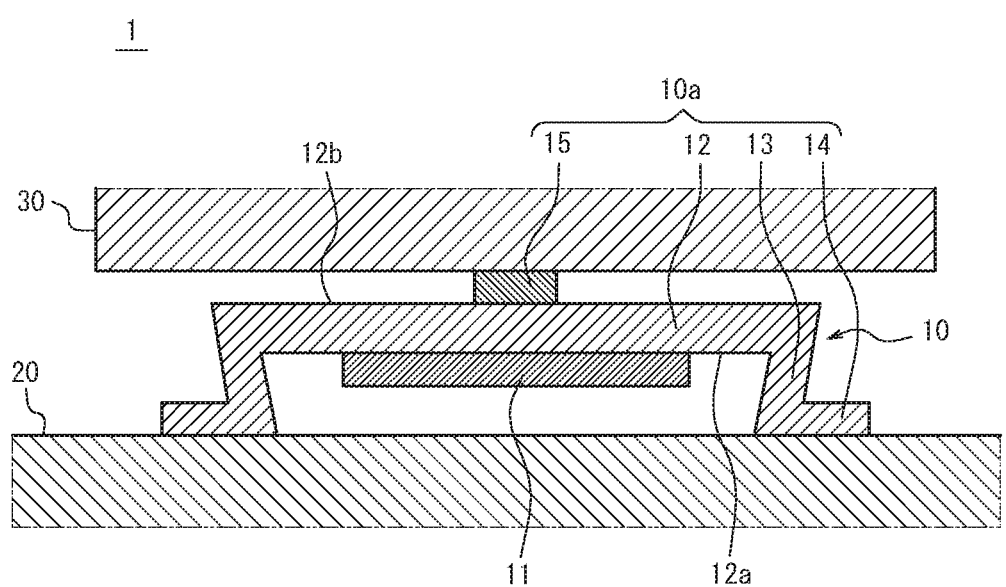
FIG. 1 is a main cross-section of an example configuration of a tactile sensation providing apparatus according to a first embodiment.

An apparatus for providing a tactile sensation provides a tactile sensation efficiently to a user by increasing the vibration of an actuator. The present disclosure relates to an actuator and a tactile sensation providing apparatus that can increase generated vibration.

An actuator and tactile sensation providing apparatus according to embodiments of the present disclosure are described below in detail with reference to the drawings.

First Embodiment

A tactile sensation providing apparatus according to a first embodiment may be used in a variety of devices. The tactile sensation providing apparatus according to the present embodiment may be an on-vehicle device such as a car navigation system, a steering wheel, or a power window switch. The tactile sensation providing apparatus may also be a mobile phone, a smartphone, a tablet personal computer (PC), a notebook PC, or the like. The tactile sensation providing apparatus is not limited to these examples and may be any of a variety of electronic devices, such as a desktop PC, a household appliance, an industrial device (factory automation (FA) device), a dedicated terminal, or the like. The drawings referred to below are schematic illustrations, and the dimensional ratios and the like in the drawings do not necessarily match the actual dimensions.

[Example Configuration of Tactile Sensation Providing Apparatus]

FIG. 1 is a main cross-section of an example configuration of a tactile sensation providing apparatus 1 according to the first embodiment. As illustrated in FIG. 1, a tactile sensation providing apparatus 1 according to the present embodiment includes an actuator 10, a housing 20, and an object of vibration 30.

The actuator 10 includes a piezoelectric element 11, a vibration plate 12, supports 13, fixing portions 14, and a holder 15. The actuator 10 is joined to the housing 20 by the fixing portions 14. The actuator 10 has the object of vibration 30 joined thereto via the holder 15.

Figure 2A:
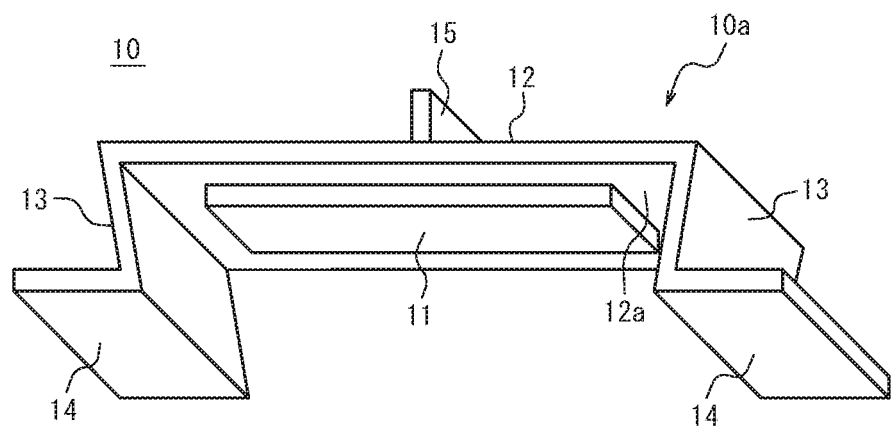
FIGS. 2A and 2B are perspective views of an example configuration of the actuator in FIG. 1.
Figure 2B:
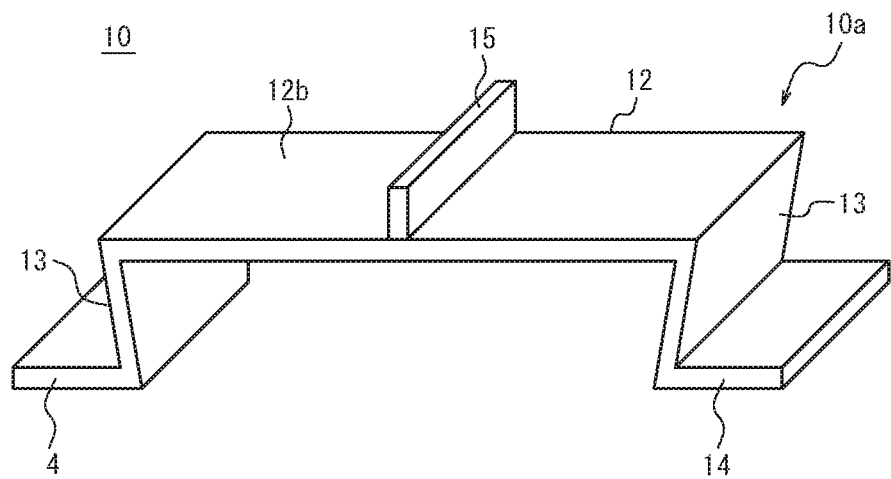

FIGS. 2A and 2B are perspective views of an example configuration of the actuator 10. FIG. 2A is a perspective view from the side joined to the housing 20. FIG. 2B is a perspective view from the side to which the object of vibration 30 is joined. Each portion of the actuator 10 is described with reference to FIGS. 1, 2A, and 2B.

The piezoelectric element 11 is, for example, rectangular. The piezoelectric element 11 expands and contracts in the longitudinal direction in a variety of patterns in accordance with an applied voltage signal. The piezoelectric element 11 may be a piezoelectric film or piezoelectric ceramic. Piezoelectric ceramic can generate vibration having a greater vibration energy than piezoelectric film can.

The vibration plate 12 is a rectangular plate-shaped member having a predetermined thickness. The vibration plate 12 is, for example, a thin plate with elasticity. The vibration plate 12 includes, for example, metal, resin, or a composite material of metal, resin, and the like. The vibration plate 12 may be a thin metal plate (sham). The surface of the vibration plate 12 facing the housing 20 is referred to below as a first surface 12a. The surface of the vibration plate 12 facing the object of vibration 30 is referred to as a second surface 12b.

The piezoelectric element 11 is provided on the first surface 12a of the vibration plate 12. The piezoelectric element 11 is arranged so that the longitudinal direction of the piezoelectric element 11 matches the longitudinal direction of the vibration plate 12. The holder 15 is provided on the second surface 12b of the vibration plate 12. The piezoelectric element 11 and the holder 15 are each joined to the vibration plate 12 by a method such as adhesion.

A structure in which the piezoelectric element 11 is provided on the first surface 12a of the vibration plate 12 is known as a monomorph. In a monomorph, the expansion and contraction of the piezoelectric element 11 provokes bending vibration of the vibration plate 12. When only one end of the vibration plate 12 is supported by the housing 20, the vibration plate 12 vibrates with the amplitude in the normal direction of the first surface 12a being maximized at the other end of the vibration plate 12. When both ends of the vibration plate 12 are supported by the housing 20, the vibration plate 12 vibrates with the amplitude in the normal direction of the first surface 12a being maximized near the center of the vibration plate 12.

A support 13 is provided at each end of the vibration plate 12 in the longitudinal direction. The supports 13 maintain a clearance between the piezoelectric element 11 and the housing 20 to prevent the piezoelectric element 11 from hitting the housing 20 when the vibration plate 12 vibrates in accordance with displacement of the piezoelectric element 11. The supports 13 are, for example, thin plates with elasticity like the vibration plate 12. The supports 13 may be made of the same or different material as the vibration plate 12. As described above, when both ends of the vibration plate 12 are supported, the vibration plate 12 vibrates in accordance with displacement of the piezoelectric element 11, with the amplitude being maximized near the center of the vibration plate 12.

One end of each support 13 is connected to the vibration plate 12. The other end of each support 13 is connected to one of the fixing portions 14. The fixing portions 14 are, for example, fixed to the housing 20 by screwing, adhesion, or the like. The fixing portions 14 are, for example, thin plates with elasticity like the vibration plate 12. The fixing portions 14 may be made of the same or different material as the vibration plate 12.

In the actuator 10 according to the present embodiment, the vibration plate 12, the supports 13, and the fixing portions 14 are integrally molded. In other words, the vibration plate 12, the supports 13, and the fixing portions 14 are made of the same material. The member in which the vibration plate 12, the supports 13, and the fixing portions 14 are integrated may, for example, be integrally molded by subjecting a thin sheet of metal to sheet-metal processing to bend the thin sheet. The vibration plate 12, the supports 13, and the fixing portions 14 may be integrally molded by welding the individual components together. The vibration plate 12, the supports 13, and the fixing portions 14 may also be formed by integrally molding resin.

The holder 15 holds the object of vibration 30. The holder 15 is, for example, made of metal. The holder 15 may be made of a material other than metal, such as a rubber material. The holder 15 is provided on the second surface 12b of the vibration plate 12. The holder 15 is joined to the vibration plate 12 using a method such as adhesion. The holder 15 is provided near the center of the second surface 12b. However, the position at which the holder 15 is provided is not limited to being near the center. The holder 15 may be provided at the portion where the amplitude of the vibration plate 12 is maximized. The holder 15 has the object of vibration 30 joined thereto by a method such as adhesion, for example.

When the holder 15 is made of a rubber material, the holder 15 may have a large elastic modulus in the vibration direction of the vibration plate 12, i.e. in the normal direction of the first surface 12a, to efficiently transmit vibration of the vibration plate 12 to the object of vibration 30. On the other hand, the holder 15 may have a small elastic modulus in a direction parallel to the first surface 12a of the vibration plate 12. This configuration reduces the likelihood of damage to the tactile sensation providing apparatus 1 due to an external force. The elastic modulus is a constant indicating the relationship between an external force acting on a member and the amount of displacement of the member. The product of the amount of displacement and the elastic modulus represents the external force. In other words, the same external force produces a larger amount of displacement as the elastic modulus is smaller.

In the present embodiment, the entire member formed by the holder 15 and the integrally molded vibration plate 12, supports 13, and fixing portions 14 is also referred to below as a frame 10a of the actuator 10.

The housing 20 has the actuator 10 joined thereto at the fixing portions 14. The housing 20 has a greater mass and a higher rigidity than the actuator 10 does. In the present embodiment, the housing 20 is therefore considered to be a rigid body.

The object of vibration 30 may, for example, be a touch sensor 50 provided in a device (see FIG. 3) or a switch. The object of vibration 30 has the actuator 10 joined thereto at the holder 15. As described above, when the housing 20 is considered to be a rigid body, the vibration generated by the actuator 10 is mainly transmitted to the object of vibration 30. Hence, the object of vibration 30 can provide a tactile sensation to the user touching the object of vibration 30.

[Example Operations of Tactile Sensation Providing Apparatus]

FIG. 3 illustrates an example of the functional blocks of the tactile sensation providing apparatus 1 according to the present embodiment. As illustrated in FIG. 3, the tactile sensation providing apparatus 1 includes the above-described actuator 10 and a controller 40. The controller 40 may be constituted by a processor, microcomputer, or the like capable of executing application software. The controller 40 may appropriately include a storage unit or the like constituted by memory or the like capable of storing various information as necessary.

As illustrated in FIG. 3, the controller 40 connects to the actuator 10. The controller 40 outputs a drive signal to the actuator 10. The drive signal is a voltage signal that is applied to the piezoelectric element 11 of the actuator 10.

The piezoelectric element 11 expands and contracts in the longitudinal direction in accordance with the drive signal acquired from the controller 40. The vibration plate 12 of the example actuator 10 illustrated in FIGS. 1, 2A, and 2B bends in accordance with displacement of the piezoelectric element 11. In other words, when the piezoelectric element 11 is displaced by contracting in the longitudinal direction of the vibration plate 12, the vibration plate 12 bends so that the second surface 12b becomes convex. When the piezoelectric element 11 is displaced by expanding in the longitudinal direction of the vibration plate 12, the vibration plate 12 bends so that the first surface 12a becomes convex. Displacement of the piezoelectric element 11 is thus converted into vibration in the normal direction of the first surface 12a of the vibration plate 12.

In the present embodiment, the piezoelectric element 11 is displaced only in the contracting direction in response to application of a voltage signal. In this case, the vibration plate 12 oscillates between a state in which the second surface 12b is bent to become convex and a flat, unbent state. The piezoelectric element 11 is not limited to being displaced in the contracting direction in response to application of a voltage signal. The piezoelectric element 11 may be configured to be displaced in the expanding direction in response to application of a voltage signal or to be displaced in both the expanding direction and the contracting direction.

In this way, the controller 40 drives the actuator 10 and vibrates the vibration plate 12. Vibration of the vibration plate 12 is transmitted to the object of vibration 30 through the holder 15. A tactile sensation is thus provided to the user touching the object of vibration 30.

As illustrated in FIG. 3, for example, the controller 40 may connect to the touch sensor 50. In this case, the controller 40 may output a drive signal to the actuator 10 in response to a signal acquired from the touch sensor 50. The touch sensor 50 may be the object of vibration 30 of the tactile sensation providing apparatus 1. In this case, a touch by the user on the object of vibration 30 is detected by the touch sensor 50. The controller 40 vibrates the object of vibration 30 when the user is touching the object of vibration 30. This configuration allows the tactile sensation providing apparatus 1 to provide a tactile sensation to the user touching the object of vibration 30. The touch sensor 50 may be provided as a separate structure from the object of vibration 30 of the tactile sensation providing apparatus 1.

[Shape of Frame]

Figure 4A:
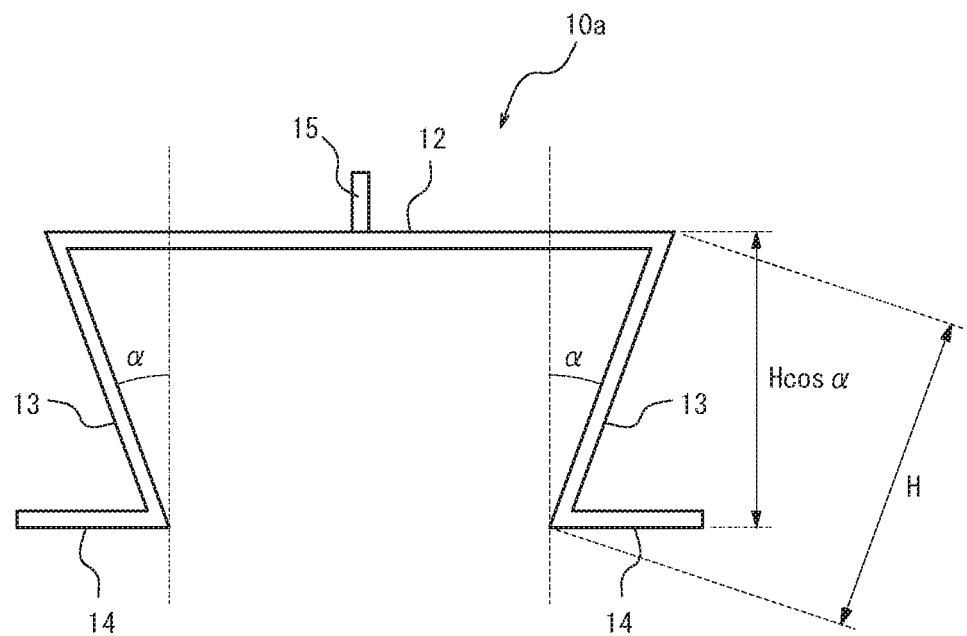
FIGS. 4A and 4B illustrate example cross-sectional shapes of a frame of the actuator in FIG. 1.
Figure 4B:
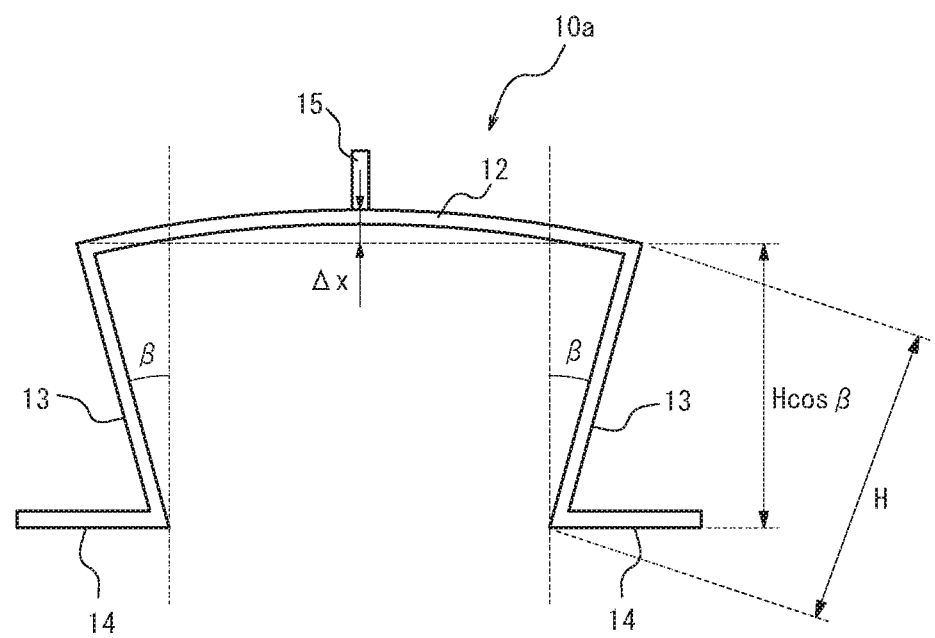

FIGS. 4A and 4B illustrate an example cross-sectional shape of the frame 10a of the actuator 10 according to the present embodiment. The frame 10a of the actuator 10 elastically deforms in response to driving of the actuator 10. FIG. 4A illustrates the shape of the frame 10a when the actuator 10 is not being driven. FIG. 4B illustrates the shape of the frame 10a when the actuator 10 is being driven. The vibration plate 12 in FIG. 4B is bent in accordance with driving of the actuator 10 so that the second surface 12b becomes convex.

As illustrated in FIG. 4A, each support 13 is arranged so that when the actuator 10 is not driven, the end of each support 13 at the side connected to the vibration plate 12 is further outward than the end at the side connected to the fixing portion 14. The supports 13 arranged in this way are also referred to as being inclined outward. In this case, the angle between the vibration plate 12 and the support 13 is acute.

The support 13 is arranged so that the angle between the normal direction of the vibration plate 12 and the support 13 becomes α. The angle (α) is also referred to below as a given angle (α). The given angle (α) is defined as a positive value when the support 13 is inclined outward relative to the normal direction of the vibration plate 12. The given angle (α) is measured in radians. Unless otherwise noted, the units of angles in the explanation below are also radians. The given angle (α) is assumed to satisfy −π≤α<π to uniquely represent the direction in which the support 13 is arranged.

The length of the support 13 is H. In this case, the distance between the end of the vibration plate 12 and the fixing portion 14 is H cos α. The distance between the end of the vibration plate 12 and the fixing portion 14 is defined as the length of a perpendicular from the end of the vibration plate 12 to a surface including the fixing portion 14.

As illustrated in FIG. 4B, the vibration plate 12 bends when the actuator 10 is being driven. The displacement of the central portion of the vibration plate 12 relative to the ends is Δx (Δx>0) assuming that the displacement from the first surface 12a side towards the second surface 12b side is positive. In accordance with the bending of the vibration plate 12, the upper end of the support 13 (the end at the side connected to the vibration plate 12) is pulled by the vibration plate 12 towards the central portion of the vibration plate 12. When the support 13 is pulled by the vibration plate 12, the angle between the normal direction of the vibration plate 12 and the support 13 becomes β. The angle (β) is also referred to below as a displacement angle (β). The displacement angle (β) is defined as a positive value when the support 13 is inclined outward. Like the range of the given angle (α), the displacement angle (β) is assumed to satisfy −π≤β<π. When the actuator 10 is driven, the upper end of the support 13 is pulled towards the central portion of the vibration plate 12. Hence, α and β satisfy the relationship α>β. The length of the support 13 is H, as in FIG. 4A. In this case, the distance between the end of the vibration plate 12 and the fixing portion 14 is H cos β.

When comparing FIG. 4A and FIG. 4B, the change (Δy) in distance between the end of the vibration plate 12 and the fixing portion 14 due to driving of the actuator 10 is given by Equation (1) below.

$$\Delta y = H(\cos \beta - \cos \alpha) \quad (1)$$

In Equation (1), α>β>0 and H>0. Hence, Δy>0.

The displacement of the actuator 10 transmitted to the object of vibration 30 is the sum of the displacement (Δx) of the central portion of the vibration plate 12 and the change (Δy) in the distance between the end of the vibration plate 12 and the fixing portion 14. Since Δy>0, the displacement of the actuator 10 transmitted to the object of vibration 30 can be increased as compared to when the angle between the support 13 and the normal direction of the vibration plate 12 does not change (Δy=0).

Comparative Example

Figure 5A:
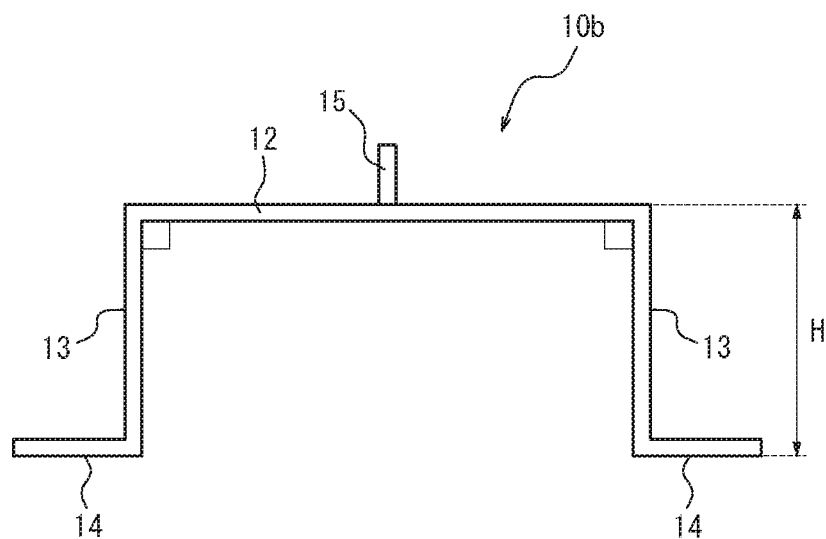
FIGS. 5A and 5B illustrate cross-sectional shapes of a frame of an actuator according to a comparative example.
Figure 5B:
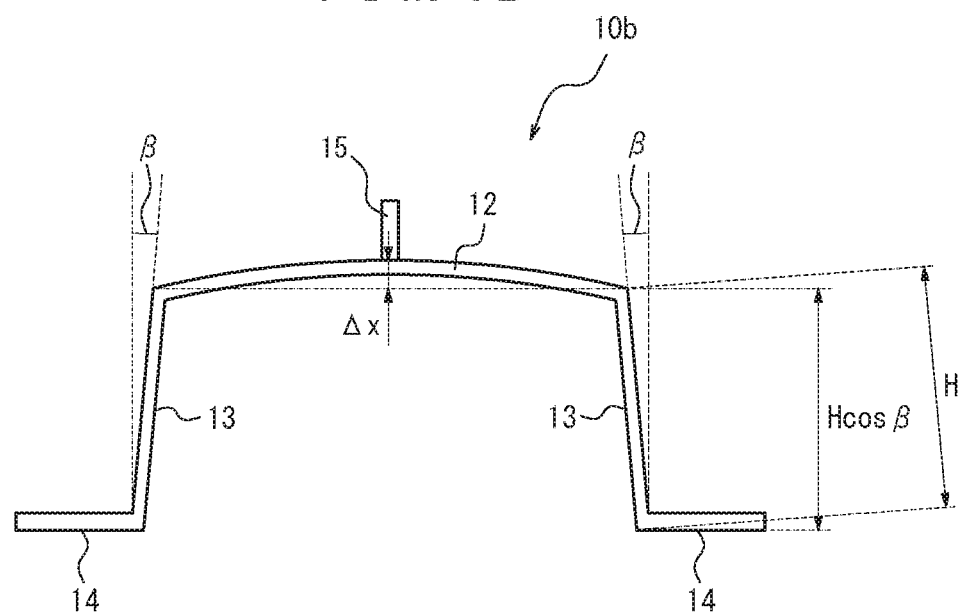

FIGS. 5A and 5B illustrate cross-sectional shapes of a frame 10b of an actuator 10 according to a comparative example. Like the frame 10a illustrated in FIG. 1 and the like, the frame 10b is a member constituted by the holder 15 and the integrally molded vibration plate 12, supports 13, and fixing portions 14. The frame 10b has a different cross-sectional shape than the frame 10a does. FIG. 5A illustrates the shape of the frame 10b when the actuator 10 is not being driven. FIG. 5B illustrates the shape of the frame 10b when the actuator 10 is being driven. The vibration plate 12 in FIG. 5B is bent in accordance with driving of the actuator 10 so that the second surface 12b becomes convex.

As illustrated in FIG. 5A, the supports 13 of the frame 10b are positioned to lie in the normal direction of the vibration plate 12 when the actuator 10 is not being driven. In other words, the supports 13 are orthogonal to the vibration plate 12 in FIG. 5A. The length of the support 13 is H. In this case, the distance between the end of the vibration plate 12 and the fixing portion 14 is the same as the length (H) of the support 13.

FIG. 5B illustrates the case of the actuator 10 being driven. In this case, the vibration plate 12 bends so that the central portion of the vibration plate 12 is displaced relative to the ends by Δx at the second surface 12b side. As in FIG. 4B, the relationship Δx>0 is satisfied assuming that the displacement from the first surface 12a side towards the second surface 12b is positive. In accordance with the bending of the vibration plate 12, the upper end of the support 13 (the end at the side connected to the vibration plate 12) is pulled by the vibration plate 12 towards the central portion of the vibration plate 12. At this time, the displacement angle of the support 13 is β (where β<0 as defined above). The length of the support 13 is H, as in FIG. 4A. In this case, the distance between the end of the vibration plate 12 and the fixing portion 14 is H cos β.

When comparing FIG. 5A and FIG. 5B, the change (Δy) in distance between the end of the vibration plate 12 and the fixing portion 14 due to driving of the actuator 10 is given by Equation (2) below.

$$\Delta y = H(\cos \beta - 1) \quad (2)$$

In Equation (2), cos β<1 and H>0. Hence, Δy<0.

The displacement of the actuator 10 transmitted to the object of vibration 30 is the sum of the displacement (Δx) of the central portion of the vibration plate 12 and the change (Δy) in the distance between the end of the vibration plate 12 and the fixing portion 14. Since Δy<0, the displacement of the actuator 10 transmitted to the object of vibration 30 is smaller than in the above-described example (Δy>0) of the cross-sectional shape of the frame 10a according to the present embodiment. Furthermore, the displacement of the actuator 10 transmitted to the object of vibration 30 is also smaller than when the angle between the support 13 and the normal direction of the vibration plate 12 does not change (Δy=0).

The support 13 thus has a given angle (α) in the cross-sectional shape of the frame 10a according to the present embodiment. In other words, the angle between the vibration plate 12 and the support 13 is acute. The displacement of the actuator 10 transmitted to the object of vibration 30 does not increase when the angle between the vibration plate 12 and the support 13 is a right angle, as in the cross-sectional shape of the frame 10b according to the comparative example. Although a detailed explanation is omitted, the displacement of the actuator 10 transmitted to the object of vibration 30 clearly does not increase when the angle between the vibration plate 12 and the support 13 is obtuse, either. Hence, the frame 10a according to the present embodiment increases the displacement of the actuator 10 transmitted to the object of vibration 30.

Next, a structure for protecting the piezoelectric element 11 in the present embodiment is described. When the piezoelectric element 11 deforms in response to pressure from an external source, the piezoelectric element 11 outputs a voltage signal having a magnitude of voltage (voltage value) with the electric characteristic of corresponding to the magnitude of the load (force) due to the press on the piezoelectric element 11 or the rate of change (acceleration) in the magnitude of the load (force). The voltage signal output from the piezoelectric element 11 is, for example, transmitted to a controller of the device in which the actuator 10 is used. The controller of the device can control the device in accordance with the acquired voltage signal.

In the present embodiment, the central portion of the vibration plate 12 bends via the holder 15 to adopt a convex shape protruding towards the housing 20 upon the user of the device pressing the object of vibration 30 (touch sensor 50), for example. At this time, the central portion of the piezoelectric element 11 also bends to adopt a convex shape protruding towards the housing 20. Consequently, a voltage signal corresponding to the press on the object of vibration 30 is output from the piezoelectric element 11.

The bending (radius of curvature) of the piezoelectric element 11 increases as the user applies stronger pressure to the object of vibration 30. If the radius of curvature of the piezoelectric element 11 reaches a predetermined value or higher, the piezoelectric element 11 may crack or suffer damage. The reliability of the actuator 10 therefore increases by structuring the actuator 10 so as to protect the piezoelectric element 11 from external pressure. Details of the structure to protect the piezoelectric element 11 in the present embodiment are described with reference to FIG. 6 through FIG. 9C.

Figure 6:
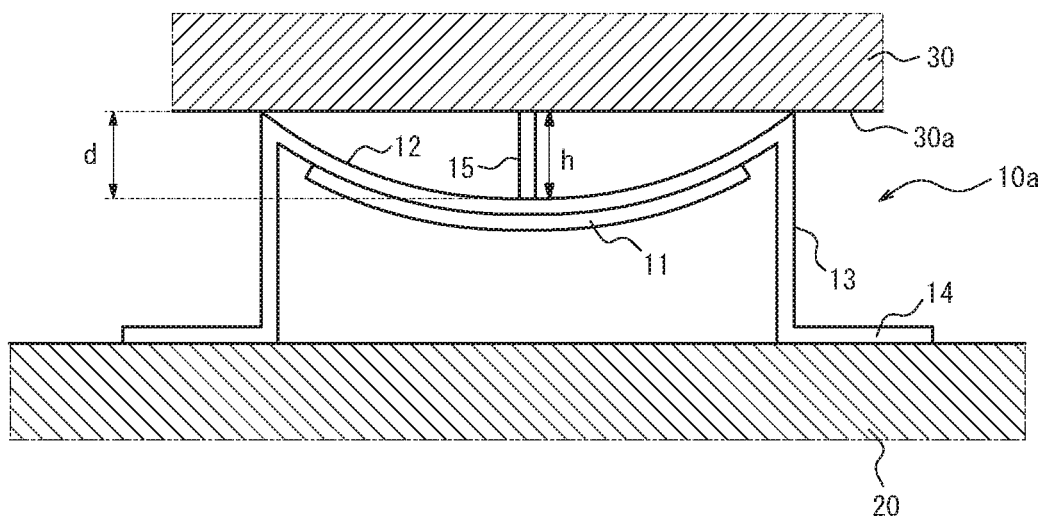
FIG. 6 illustrates an example of the state in which a piezoelectric element is bent.

FIG. 6 illustrates an example of the state in which the piezoelectric element 11 is bent due to a press by the user on the object of vibration 30. As illustrated in FIG. 6, when the object of vibration 30 is displaced towards the housing 20 due to a press by the user or the like, the holder 15 is displaced towards the housing 20 by pressure from the object of vibration 30. As a result, the central portion of the vibration plate 12 is pushed down towards the housing 20. Consequently, the central portions of the vibration plate 12 and the piezoelectric element 11 provided on the vibration plate 12 bend to adopt a convex shape protruding towards the housing 20. At this time, the upper portion of the support 13 is pulled towards the central portion of the vibration plate 12, and the angle between the normal direction of the vibration plate 12 and the support 13 becomes smaller than the given angle α when the object of vibration 30 is not pressed. When the height difference between the central portion and the ends of the vibration plate 12 becomes equivalent to the height of the holder 15, a bottom 30a of the object of vibration 30 contacts the ends of the vibration plate 12 (i.e. the upper ends of the supports 13). Consequently, the supports 13 function as stoppers preventing further displacement of the object of vibration 30 in the direction of the housing 20. The height difference between the central portion and the ends of the vibration plate 12 is defined as the length of a perpendicular from a straight line (a plane), defined by the two ends of the vibration plate 12, to the central portion. In FIG. 6, the height difference is d. In the present disclosure, this height difference is also referred to as bending displacement of the vibration plate 12. In particular, the bending displacement when the bottom 30a of the object of vibration 30 and the upper ends of the supports 13 are in contact, as illustrated in FIG. 6, is referred to as the maximum bending displacement. The height of the holder 15 is the length of the holder 15 in the normal direction of the bottom 30a, held by the holder 15, of the object of vibration 30. In other words, the height of the holder 15 in the present embodiment is defined as the length from the position at which the holder 15 is attached to the vibration plate 12 (the central portion in the present embodiment) to the bottom 30a of the object of vibration 30. In FIG. 6, this height is h.

When the vibration plate 12 is in a bent state such that the bottom 30a of the object of vibration 30 contacts the upper ends of the supports 13, the vibration plate 12 bends no further. Consequently, the piezoelectric element 11 also bends no further. Damage to the piezoelectric element 11 can therefore be prevented by determining the height of the holder 15 so that, in a state where the bottom 30a of the object of vibration 30 is in contact with the upper ends of the supports 13, the piezoelectric element 11 is in a bent state that produces no damage.

Figure 7:
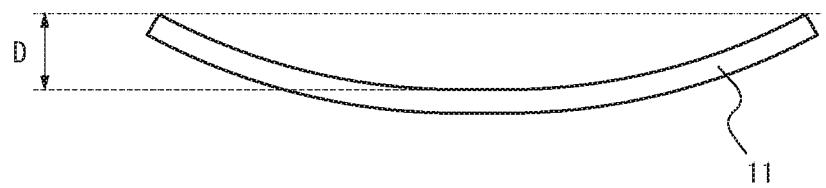
FIG. 7 schematically illustrates the bent state of the piezoelectric element.

In the present disclosure, the difference in displacement from the central portion to the ends of the piezoelectric element 11 when the piezoelectric element 11 bends due to an external force is referred to as the bending displacement. As illustrated in FIG. 7, the difference in displacement from the central portion to the ends of the piezoelectric element 11 is defined by the length of a perpendicular from a straight line (a plane), defined by the two ends of the piezoelectric element 11, to the central portion. The bending displacement is D in FIG. 7. In the present disclosure, the largest bending displacement at which the piezoelectric element 11 is not damaged is referred to as the maximum bending displacement $D_{max}$.

In the present embodiment, the height h of the holder 15 is less than the maximum bending displacement $D_{max}$ of the piezoelectric element 11. If the height h of the holder 15 is less than the maximum bending displacement $D_{max}$ of the piezoelectric element 11, i.e. if $h<D_{max}$, then the upper ends of the supports 13 contact the bottom 30a of the object of vibration 30 before the piezoelectric element 11 reaches the maximum bending displacement $D_{max}$. Therefore, the bending displacement D of the piezoelectric element 11 does not exceed the maximum bending displacement $D_{max}$, and the piezoelectric element 11 is protected.

As described above, when the bottom 30a of the object of vibration 30 contacts the upper ends of the supports 13, the supports 13 prevent further displacement of the object of vibration 30. Consequently, the supports 13 are pressed by the object of vibration 30. If the supports 13 are at right angles to the bottom 30a when the upper ends of the supports 13 contact the bottom 30a, the supports 13 can support the pressure from the object of vibration 30 more efficiently.

Figure 8A:
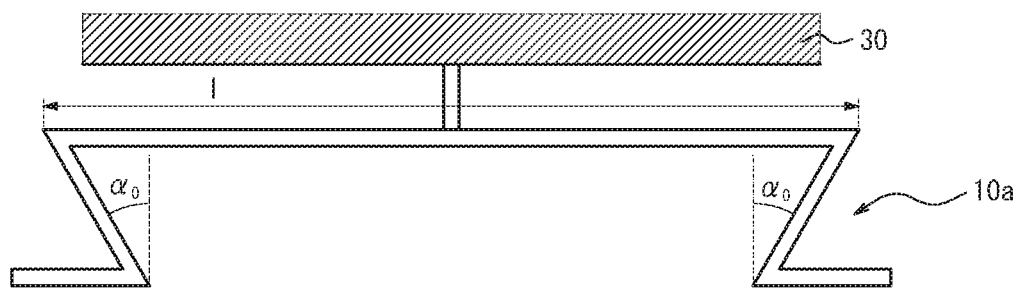
FIGS. 8A, 8B, and 8C schematically illustrate a given angle of a support.
Figure 8B:
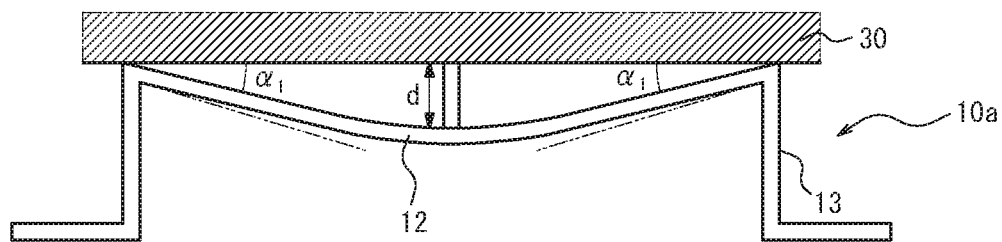
Figure 8C:
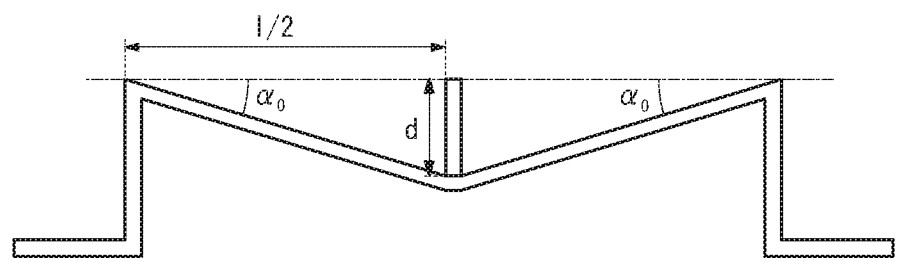

A given angle $\alpha_0$ such that the supports 13 contact the bottom 30a at right angles upon the upper ends of the supports 13 contacting the bottom 30a is now described. FIGS. 8A, 8B, and 8C schematically illustrate the given angle $\alpha_0$ of the supports 13. The length of the vibration plate 12 in the longitudinal direction is l.

As illustrated in FIG. 8A, the given angle is $\alpha_0$ when the vibration plate 12 is not being pressed. When the vibration plate 12 is pressed by the object of vibration 30 and the bottom 30a contacts the upper ends of the supports 13, the supports 13 are at right angles to the bottom 30a, as illustrated in FIG. 8B. At this time, the angle between the bottom 30a and the vibration plate 12 is defined as $\alpha_1$. Here, the bending displacement d of the vibration plate 12 is minute relative to the length l of the vibration plate 12 in the longitudinal direction. Hence, $\alpha_1$ can be approximated as $\alpha_0$. FIG. 8B, which illustrates the bent state of the vibration plate 12, can therefore be considered equivalent to FIG. 8C.

In the equivalent diagram in FIG. 8C, Equation (3) below holds.

$$\tan \alpha_0 = d/(l/2) = 2d/l \qquad (3)$$

Consequently, $\alpha_0$ is expressed by Equation (4).

$$\alpha_0 = \arctan(2d/l) \qquad (4)$$

Since the piezoelectric element 11 is provided on the first surface 12a of the vibration plate 12, the length of the piezoelectric element 11 in the longitudinal direction is less than the length of the vibration plate 12 in the longitudinal direction. Therefore, the bending displacement D of the piezoelectric element 11 is equal to or less than the bending displacement d of the vibration plate 12. Consequently, it suffices for the maximum bending displacement $D_{max}$ of the piezoelectric element 11 to be equal to or less than the bending displacement d of the vibration plate 12, and the given angle $\alpha_0$ can be defined as $\arctan(2D_{max}/l)$ by substituting $D_{max}$ for d in Equation (4).

When the upper ends of the supports 13 contact the bottom 30a, the supports 13 do not have to be at right angles to the bottom 30a. The supports 13 may contact the bottom 30a at a substantially right angle to the bottom 30a. A "substantially right angle" includes the case of the supports 13 being capable of supporting pressure from the object of vibration 30 without buckling.

When the bottom 30a of the object of vibration 30 contacts the upper ends of the supports 13, stress easily concentrates at the upper ends of the supports 13. Therefore, the supports 13 may have a structure, at the upper ends where stress easily concentrates, that is capable of dispersing or absorbing stress.

Figure 9A:
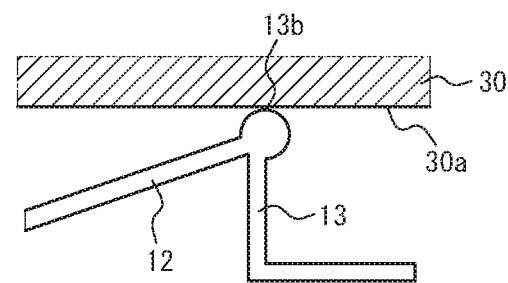
FIGS. 9A, 9B, and 9C illustrate example configurations of the upper end of a support.
Figure 9B:
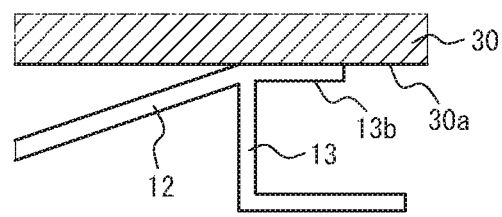
Figure 9C:
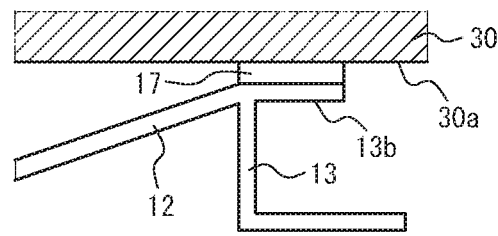

FIGS. 9A, 9B, and 9C illustrate example configurations of the upper end of the support 13. For example, the upper end of the support 13 may be structured to have a curved surface in a cross-sectional view, as illustrated in FIG. 9A. In this case, the curved surface of the support 13 supports the bottom 30a at a support surface 13b. For example, the upper end of the support 13 may include a support surface 13b, on the opposite side of the upper end from the vibration plate 12, that contacts and supports the bottom 30a when the upper end of the support 13 contacts the bottom 30a. The support surface 13b is arranged to be orthogonal to the support 13, as illustrated in FIG. 9B, when the support 13 contacts the bottom 30a at a right angle upon the upper end contacting the bottom 30a, as described with reference to FIGS. 8A to 8C. The support surface 13b may also include a buffer material 17 on the surface that contacts the bottom 30a, as illustrated in FIG. 9C. By having this structure, the support 13 can disperse or absorb stress acting on the upper end when the upper end contacts the bottom 30a.

In this way, the height of the holder 15 in the frame 10a according to the present embodiment is less than the maximum bending displacement $D_{max}$ of the piezoelectric element 11. Consequently, the supports 13 support the object of vibration 30 at the upper ends even when pressure is applied to the piezoelectric element 11 from the object of vibration 30 through the holder 15. The piezoelectric element 11 thus does not bend to or beyond the maximum bending displacement $D_{max}$. Therefore, the tactile sensation providing apparatus 1 according to the present embodiment facilitates protection of the piezoelectric element 11.

Second Embodiment

Figure 10:
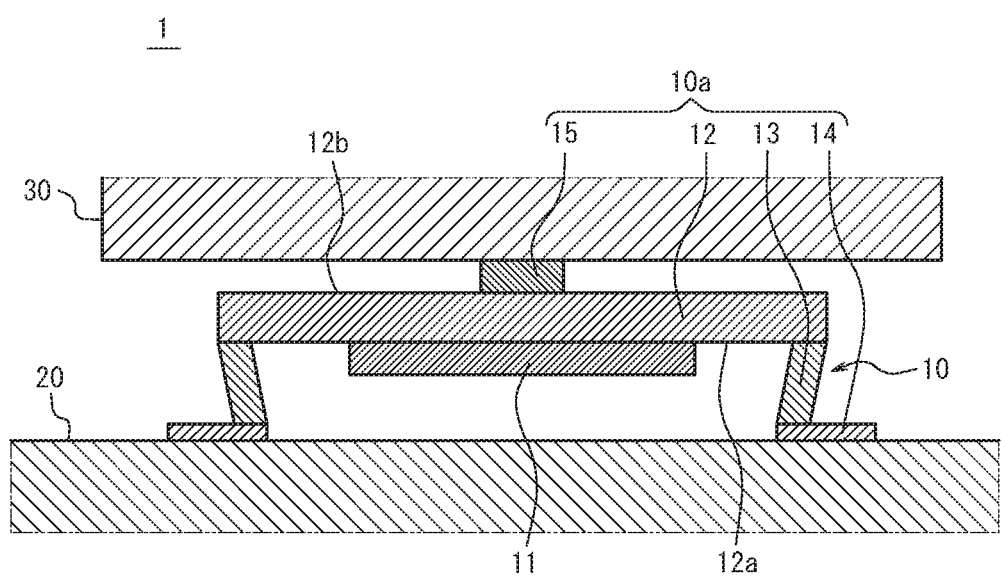
FIG. 10 illustrates an example cross-sectional shape of a frame of an actuator according to a second embodiment.

In the first embodiment, the vibration plate 12, supports 13, and fixing portions 14 are integrally molded from the same material. In the second embodiment, the vibration plate 12 and the fixing portions 14 are made of a different material from the supports 13. FIG. 10 is a main cross-section of an example configuration of a tactile sensation providing apparatus 1 according to the second embodiment. A description of matter identical to the first embodiment is omitted as appropriate to focus mainly on the differences.

The vibration plate 12 and the fixing portions 14 of the present embodiment are, for example, thin plates with elasticity as in the first embodiment. The material of the vibration plate 12 and the material of the fixing portions 14 may be the same or different. On the other hand, the supports 13 are pillars made of curable resin, for example, and are members with a large elastic modulus in the normal direction of the vibration plate 12. The supports 13 may be made of another material, such as metal. The supports 13 are configured to elastically deform at the joint with the vibration plate 12 and the joint with the fixing portion 14. The supports 13 can therefore move so as to incline.

In the present embodiment, the vibration plate 12 and the supports 13 are different materials that are integrally molded together. For example, the vibration plate 12 and the supports 13 may be integrally molded by being welded together. Alternatively, the vibration plate 12 and the supports 13 may be integrally molded by molding resin that becomes the supports 13 around a metal vibration plate 12. The vibration plate 12 and the supports 13 may also be integrally molded by providing fitting portions in a metal vibration plate 12 and then engaging supports 13 made of resin with the fitting portions. The vibration plate 12 and the supports 13 may also be integrally molded by providing a joining face, with primer applied thereto, on a surface of a metal vibration plate 12 and molding resin onto the joining face. The vibration plate 12 and the supports 13 may also be integrally molded by providing a joining face, on which microfabrication has been performed, on a surface of a metal vibration plate 12 and molding resin onto the joining face.

The vibration plate 12 and the supports 13 made of different materials are integrally molded in the actuator 10 according to the present embodiment. As compared to when the vibration plate 12 and the supports 13 are configured as separate components, the present embodiment allows a reduction in the number of components and assembly steps while the supports 13 reduce attenuation of the vibration of the vibration plate 12 generated in accordance with displacement of the piezoelectric element 11. By adhesive not being used between the vibration plate 12 and the supports 13, the actuator 10 according to the present embodiment can lengthen the mean time between failure (MTBF) and improve the yield at the time of assembly.

As in the first embodiment, the angle between the vibration plate 12 and the support 13 is acute in the actuator 10 according to the second embodiment. Therefore, the actuator 10 according to the present embodiment can further increase the displacement of the actuator 10 transmitted to the object of vibration 30 as compared to when the angle between the vibration plate 12 and the support 13 is not acute.

Other Embodiments

Figure 11A:
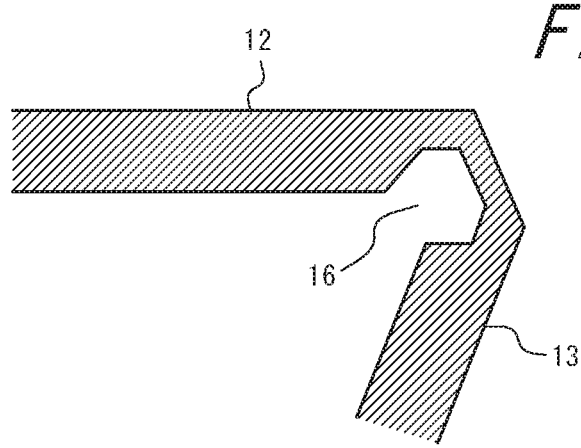
FIGS. 11A, 11B, and 11C illustrate example cross-sectional shapes of a joint between a vibration plate and a support.
Figure 11B:
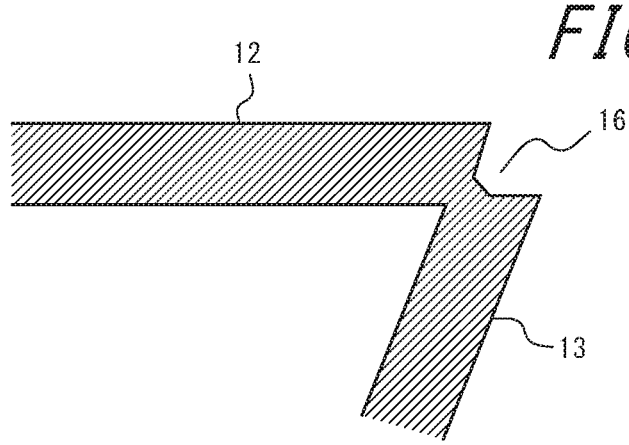
Figure 11C:
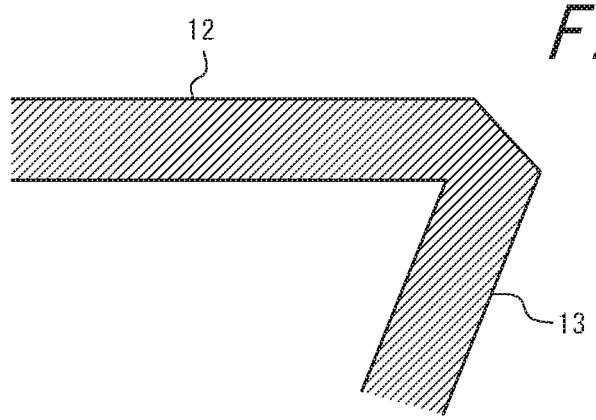

FIGS. 11A, 11B, and 11C illustrate examples of the cross-sectional shape of a joint between the vibration plate 12 and the support 13. FIG. 11A illustrates an example of the cross-sectional shape when a notch 16 is provided on the inside of the joint (the side that connects to the first surface 12a of the vibration plate 12). FIG. 11B illustrates an example of the cross-sectional shape when a notch 16 is provided on the outside of the joint (the side that connects to the second surface 12b of the vibration plate 12). FIG. 11C illustrates a comparative example in which a notch 16 is not provided on the inside or the outside.

The joint between the vibration plate 12 and the support 13 in FIGS. 11A and 11B bends more easily than the example illustrated in FIG. 11C by virtue of the notch 16 being provided. The upper portion of the support 13 is therefore pulled towards the central portion of the vibration plate 12 more easily, preventing bending of the vibration plate 12 from being impeded when the actuator 10 is driven.

The notch 16 illustrated in FIGS. 11A and 11B may be provided in the joint between the support 13 and the fixing portion 14. This configuration can increase the difference between the given angle ($\alpha$) and the displacement angle ($\beta$) of the support 13.

Figure 12A:
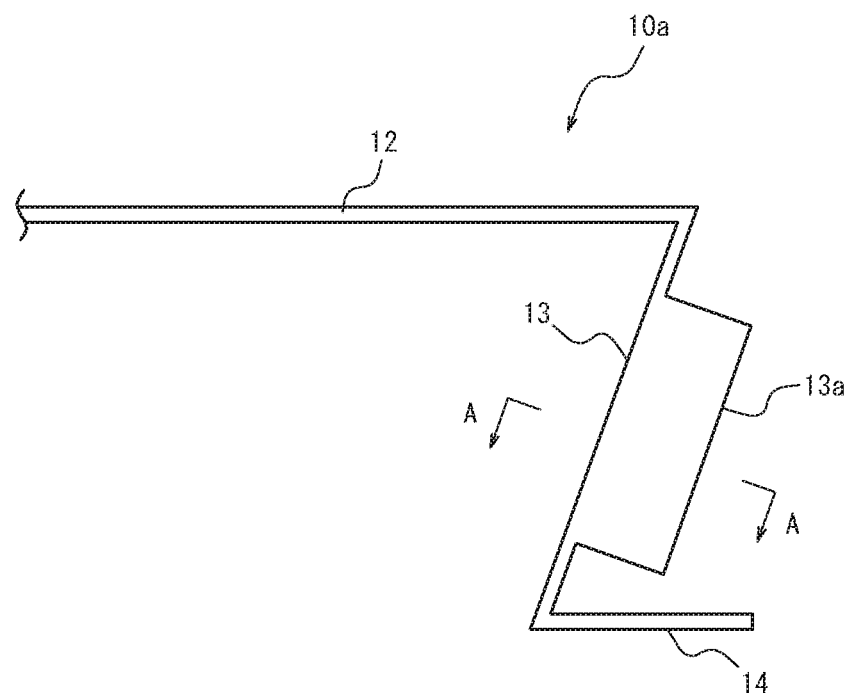
FIGS. 12A and 12B illustrate an example support provided with a rib.
Figure 12B:
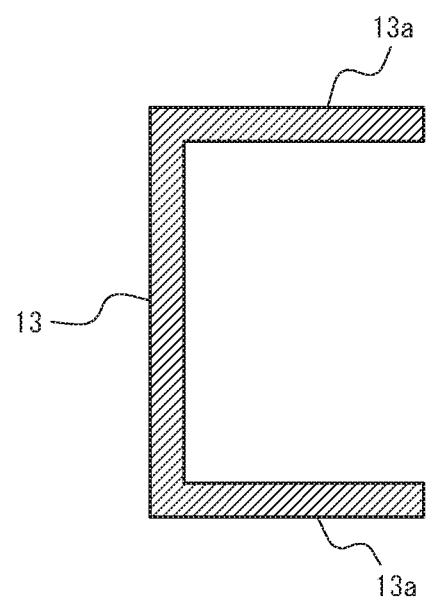

FIGS. 12A and 12B illustrate examples of a support 13 provided with a rib 13a. FIG. 12A illustrates an example cross-sectional shape of the frame of the actuator 10. FIG. 12B is a cross-section along the A-A line in FIG. 12A. Provision of the rib 13a in the support 13 as illustrated in FIG. 12B increases the rigidity of the support 13 relative to the normal direction of the vibration plate 12. In other words, this configuration can reduce the amount of deformation of the support 13 due to the force acting on the support 13 as a reaction to the force that the actuator 10 exerts on the object of vibration 30. The vibration generated by the actuator 10 thus tends to be absorbed less by the support 13. Consequently, the vibration generated by the actuator 10 is transmitted more efficiently to the object of vibration 30.

The supports 13 may be configured so that the ends of the vibration plate 12 are displaced more in the longitudinal direction than in the normal direction of the vibration plate 12 in accordance with expansion and contraction of the piezoelectric element 11. When the supports 13 are thus configured for smaller displacement of the ends of the vibration plate 12 in the normal direction of the vibration plate 12, the vibration of the vibration plate 12 is efficiently transmitted to the object of vibration 30. When the supports 13 are configured for greater displacement of the ends of the vibration plate 12 in the longitudinal direction of the vibration plate 12, attenuation of the vibration of the vibration plate 12 is reduced.

Figure 13A:
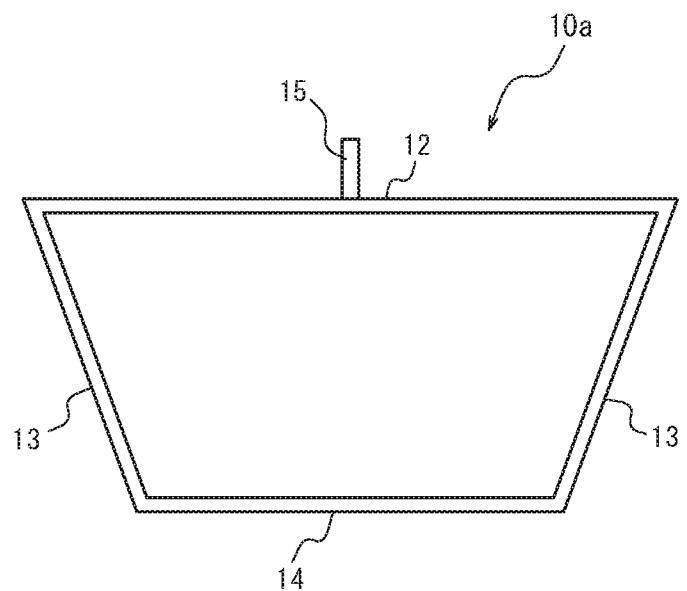
FIGS. 13A and 13B illustrate example frames in which fixing portions at either side are bent inward and connected.
Figure 13B:
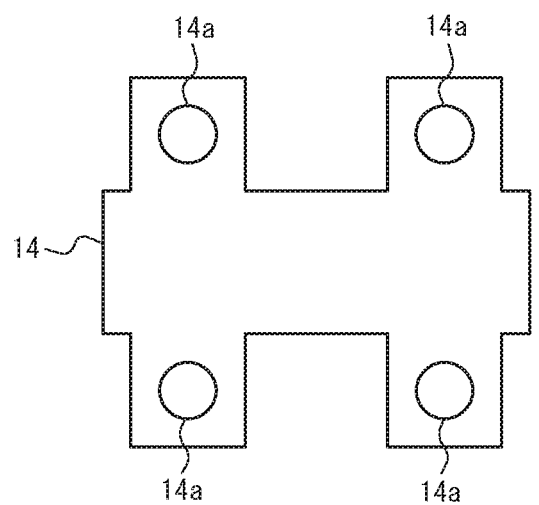

FIGS. 13A and 13B illustrate example frames in which the fixing portions 14 at either side are bent inward and connected. FIG. 13A illustrates the cross-sectional shape of a frame. FIG. 13B is a plan view of the frame. The cross-sectional shape of the frame becomes trapezoidal as a result of the fixing portions 14 being connected as in FIG. 13A. This structure increases the strength of the frame as compared to when the fixing portions 14 are formed separately. In FIG. 13B, screw holes 14a are provided beside the fixing portions 14 to facilitate screwing of the fixing portions 14 to the housing 20.

(Example of Calculating Displacement)

Figure 14A:
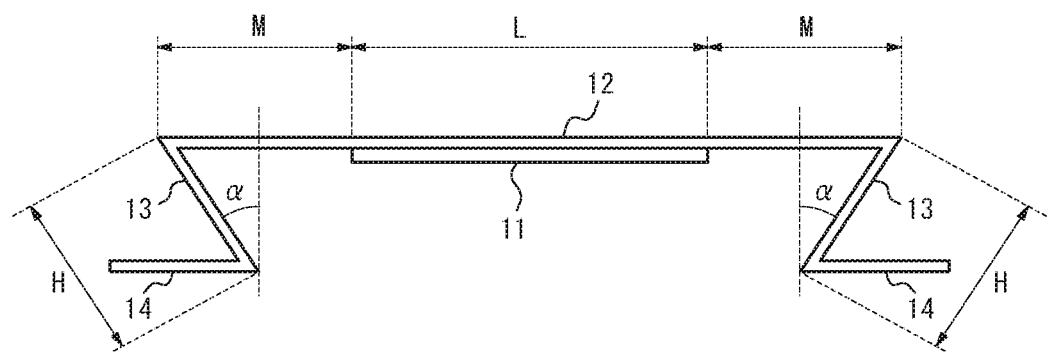
FIGS. 14A and 14B illustrate example dimensions of each part when an actuator is driven.
Figure 14B:
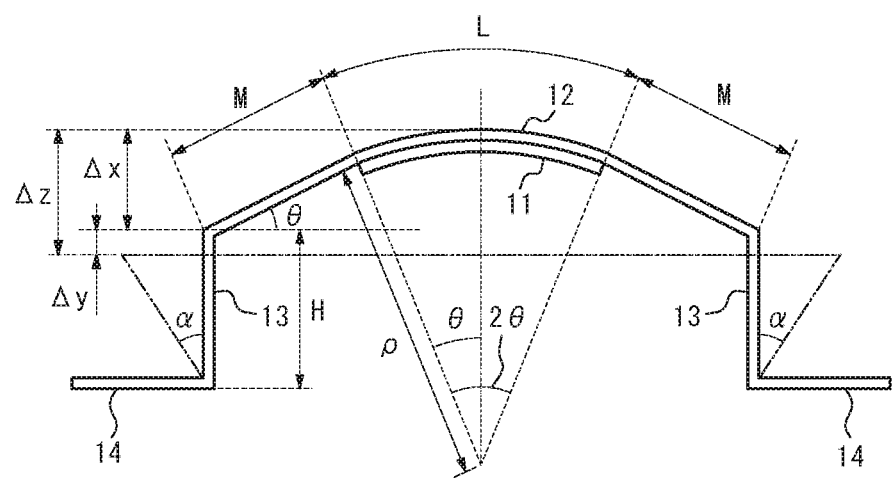

FIGS. 14A and 14B illustrate example dimensions of each part at the time of driving of the actuator 10. Here, an example of calculating the displacement of the central portion of the vibration plate 12 when the actuator 10 is driven is described with reference to FIGS. 14A and 14B. Note that the holder 15 is omitted in FIGS. 14A and 14B.

FIG. 14A illustrates example dimensions of each part when the actuator 10 is not being driven. The longitudinal dimension of the piezoelectric element 11 is L. The piezoelectric element 11 is disposed at a distance (M) from each end of the vibration plate 12. The longitudinal dimension of the vibration plate 12 is L+2M. The length of the support 13 is H. The angle (given angle) formed by the support 13 and the normal direction of the vibration plate 12 is α. The ends of the supports 13 connected to the fixing portions 14 are fixed by the fixing portions 14. The supports 13 are pivotable about the ends of the supports 13.

FIG. 14B illustrates example dimensions of each part when the actuator 10 is driven. As a result of contraction of the piezoelectric element 11, the vibration plate 12 bends so that the second surface 12b becomes convex (see FIG. 1). The shape of the vibration plate 12 and the support 13 when the actuator 10 is not being driven is indicated in FIG. 14B by dashed double-dotted lines. The displacement (Δx) of the central portion of the vibration plate 12 relative to the ends (the joints between the vibration plate 12 and the supports 13) is given by Equation (5) below.

$$\Delta x = M \sin\theta + \rho(1-\cos\theta) \quad (5)$$

In Equation (5), ρ is the radius of curvature when the vibration plate 12 bends, and θ is the difference in the angle between the bent state and the unbent state at the ends of the vibration plate 12. The interior angle of the bent portion of the vibration plate 12, i.e. the interior angle of the sector having the bent portion as an arc, is expressed as 2θ. The radius of curvature (ρ) and the interior angle (2θ) are determined by factors such as the amount of displacement of the piezoelectric element 11 or the ratio between the thickness of the piezoelectric element 11 and the thickness of the vibration plate 12.

When the radius of curvature (ρ) or the interior angle (2θ) of the bent portion is known, the displacement angle (β) of the support 13 can be calculated with Equation (6) below.

$$\beta = \alpha - M(1-\cos\theta)/H \quad (6)$$

In Equation (6), an approximation based on the Taylor expansion of a trigonometric function is used, taking α, β, and θ to be minute values. In other words, it is assumed that $\sin\alpha \approx \alpha$, $\sin\beta \approx \beta$, and $\sin\theta \approx \theta$. Furthermore, it is assumed that $\sin\theta \approx L/2\rho$.

When the support 13 is parallel to the normal direction of the vibration plate 12, the displacement angle (β) of the support 13 becomes 0 in accordance with the radius of curvature (ρ) and the interior angle (2θ). When β=0 in Equation (6), the given angle (α) satisfies the relationship in Equation (7) below.

$$\alpha = M(1-\cos\theta)/H \quad (7)$$

In FIG. 14B, bending of the vibration plate 12 causes the supports 13 to become parallel to the normal direction of the vibration plate 12 when the actuator 10 is not driven. In this case, the change (Δy) in the distance between the end of the vibration plate 12 and the fixing portion 14 is given by Equation (8) below.

$$\Delta y = H(1-\cos\theta) \quad (8)$$

The displacement (Δz) of the central portion of the vibration plate 12 is the sum of Δx and Δy. Accordingly, the displacement (Δz) of the central portion of the vibration plate 12 illustrated in FIG. 14B is given by Equation (9) below, which is based on Equation (5) and Equation (8).

$$\Delta z = M\sin\theta + \rho(1-\cos\theta) + H(1-\cos\theta) \quad (9)$$

On the basis of Equation (1), the relationship Δy>0 is satisfied when the given angle (α) and the displacement angle (β) satisfy the relationship cos α<cos β. Here, the relationship α>β is satisfied in the actuator 10 according to the first embodiment and the like. Hence, Δy>0 if β≥0. It follows that Equation (10) below represents a sufficient condition on the given angle (α) for the relationship Δy>0 to be satisfied.

$$\alpha \geq M(1-\cos\theta)/H \quad (10)$$

Accordingly, an appropriate setting of the given angle (α) of the support 13 to satisfy Equation (10) increases the amplitude of the central portion of the vibration plate 12.

Although embodiments have been described with reference to the drawings and examples, it is to be noted that various changes and modifications will be apparent to those skilled in the art based on the present disclosure. Therefore, such changes and modifications are to be understood as included within the scope of the present disclosure.

The invention claimed is:

1. An actuator comprising:
a piezoelectric element;
a vibration plate that has the piezoelectric element joined thereto and is configured to vibrate an object of vibration in accordance with expansion and contraction of the piezoelectric element;
a pair of supports, each of the supports being configured to support the vibration plate on a respective fixing portion; and
a holder joined to the vibration plate and configured to hold the object of vibration;
wherein a height of the holder is less than a maximum bending displacement at which the piezoelectric element is not damaged by an external force, and
a distance between ends of the supports on the respective fixing portions is less than a length in a longitudinal direction of the vibration plate between the pair of supports.

2. The actuator of claim 1,
wherein the vibration plate and the pair of supports are integrally molded.

3. The actuator of claim 2, wherein an angle between the vibration plate and each of the supports is acute.

4. The actuator of claim 2, wherein an angle between the vibration plate and each of the supports is a substantially right angle when an end of the support contacts the object of vibration due to pressure from the object of vibration.

5. The actuator of claim 4, wherein the end of each of the supports comprises a support surface configured to support the object of vibration.

6. The actuator of claim 5, wherein the support surface further comprises a buffer material on a portion of the support surface that contacts the object of vibration.

7. The actuator of claim 1, wherein each of the supports is configured so that an end of the vibration plate is displaced more in a direction of the expansion and contraction of the piezoelectric element than in a normal direction of the vibration plate in accordance with the expansion and contraction of the piezoelectric element.

8. The actuator of claim 2, wherein
an angle between a portion of each of the supports supporting one of the edges of the vibration plate in the longitudinal direction and the vibration plate changes from a first acute angle to a second acute angle smaller than the first acute angle when pressing the vibration plate such that:
both edges of the vibration plate in the longitudinal direction are disposed inwardly toward the center of the vibration plate, and
the supports and the object of vibration are in contact with each other.

9. The actuator of claim 1, wherein each of the supports has another end connected to the vibration plate and positioned opposite to the end of the support connected to a respective one of the fixing portions.

10. A tactile sensation providing apparatus comprising:
an actuator comprising:
- a piezoelectric element;
- a vibration plate that has the piezoelectric element joined thereto and is configured to vibrate in accordance with expansion and contraction of the piezoelectric element;
- a pair of supports, each of the supports being configured to support the vibration plate on a respective fixing portion; and
- a holder joined to the vibration plate; and an object of vibration held by the holder and configured to provide a tactile sensation to a user by vibration of the vibration plate being transmitted to the object of vibration;

wherein a height of the holder is less than a maximum bending displacement at which the piezoelectric element is not damaged by an external force, and a distance between ends of the supports on the respective fixing portions is less than a length in a longitudinal direction of the vibration plate between the pair of supports.

\* \* \* \* \*